(12) United States Patent
Uno et al.

(10) Patent No.: US 11,178,764 B2
(45) Date of Patent: Nov. 16, 2021

(54) FLEXIBLE SUBSTRATE, ELECTRONIC DEVICE, AND METHOD FOR MANUFACTURING ELECTRONIC DEVICE

(71) Applicants: PI-CRYSTAL INCORPORATION, Kashiwa (JP); OSAKA RESEARCH INSTITUTE OF INDUSTRIAL SCIENCE AND TECHNOLOGY, Izumi (JP)

(72) Inventors: Mayumi Uno, Osaka (JP); Kazuki Maeda, Osaka (JP); Masashi Nitani, Osaka (JP); Busang Cha, Chiba (JP); Junichi Takeya, Chiba (JP)

(73) Assignees: Pi-Crystal Incorporation, Chiba (JP); Osaka Research Institute of Industrial Science and Technology, Osaka (JP)

(\*) Notice: Subject to any disclaimer, the term of this patent is extended or adjusted under 35 U.S.C. 154(b) by 0 days.

(21) Appl. No.: 16/962,171

(22) PCT Filed: Dec. 25, 2018

(86) PCT No.: PCT/JP2018/047444
§ 371 (c)(1),
(2) Date: Jul. 14, 2020

(87) PCT Pub. No.: WO2019/138855
PCT Pub. Date: Jul. 18, 2019

(65) Prior Publication Data
US 2020/0344880 A1   Oct. 29, 2020

(30) Foreign Application Priority Data
Jan. 15, 2018   (JP) .............................. JP2018-004502

(51) Int. Cl.
*H05K 1/11* (2006.01)
*H05K 1/09* (2006.01)
(Continued)

(52) U.S. Cl.
CPC ............... *H05K 1/118* (2013.01); *H05K 1/09* (2013.01); *H05K 1/14* (2013.01); *H05K 3/12* (2013.01);
(Continued)

(58) Field of Classification Search
CPC ....... H05K 2201/053; H05K 2201/058; H05K 1/118; H05K 3/12; H05K 1/09;
(Continued)

(56) References Cited

U.S. PATENT DOCUMENTS

| 4,589,584 A | 5/1986 | Christiansen et al. |
| 5,776,587 A | 7/1998 | Angelopoulos et al. |

(Continued)

FOREIGN PATENT DOCUMENTS

| JP | 49-4701 B | 2/1974 |
| JP | 1-196845 | 8/1989 |

(Continued)

OTHER PUBLICATIONS

DUPONT 5000 data sheet (Year: 2020).*
(Continued)

*Primary Examiner* — Steven T Sawyer
(74) *Attorney, Agent, or Firm* — Hamre, Schumann, Mueller & Larson, P.C.

(57) ABSTRACT

A flexible substrate and an electronic device having high flexibility as a whole including an element mounting portion and a connection terminal portion, and a production method of the electronic device are provided. The flexible substrate includes a flexible base, and a conductive wiring made of a conductive organic compound formed on the base, wherein (Continued)

part of the conductive wiring serves as a connection part with another electronic member. Further, an electronic device 100 includes flexible bases 11 and 21, conductive wirings 13 and 23 made of a conductive organic compound formed on the bases, and electronic elements 12 and 22 connected to the conductive wirings, wherein part of the conductive wiring serves as a connection part 30 with another substrate.

17 Claims, 6 Drawing Sheets

(51) Int. Cl.
    *H05K 1/14*     (2006.01)
    *H05K 3/12*     (2006.01)
    *H05K 3/36*     (2006.01)
    *B29L 31/34*     (2006.01)

(52) U.S. Cl.
    CPC ...... *H05K 3/361* (2013.01); *B29L 2031/3425* (2013.01)

(58) Field of Classification Search
    CPC ............ H05K 3/361; H05K 1/14; H05K 3/36; H05K 1/147; H05K 1/0393; H05K 2201/0326; B29L 2031/3425
    See application file for complete search history.

(56) References Cited

U.S. PATENT DOCUMENTS

| | | | |
|---|---|---|---|
| 2006/0003568 A1* | 1/2006 | Choi | ................ H05K 3/28 438/610 |
| 2008/0136012 A1* | 6/2008 | Yang | ................ H01L 27/14618 257/698 |
| 2008/0136021 A1* | 6/2008 | Yang | ................ H01L 25/50 257/737 |
| 2012/0055703 A1* | 3/2012 | Ishimatsu | .............. H05K 3/361 174/257 |
| 2013/0153834 A1* | 6/2013 | Kumashiro | .......... C09D 11/324 252/511 |
| 2016/0064468 A1* | 3/2016 | Abe | ................ H05K 3/361 257/40 |
| 2018/0255639 A1* | 9/2018 | Bergman | ............. D03D 1/0082 |
| 2019/0305048 A1* | 10/2019 | Chang | ................... H01L 27/281 |

FOREIGN PATENT DOCUMENTS

| | | |
|---|---|---|
| JP | 1-043438 | 9/1989 |
| JP | 5-81161 | 11/1993 |
| JP | 7-094861 | 4/1995 |
| JP | 2003-141478 | 5/2003 |
| JP | 2006-187730 | 7/2006 |
| JP | 2011-237661 | 11/2011 |
| JP | 2015-149364 | 8/2015 |
| JP | 2016-082070 | 5/2016 |

OTHER PUBLICATIONS

International Search Report issued in International Application No. PCT/JP2018/047444, dated Mar. 26, 2019, 3 pages with translation.
Office Action issued in corresponding Japanese Patent Application No. 2019-564611, dated Sep. 30, 2021, 8 pages w/ translation.
Extended European Search Report, issued in the corresponding European Patent Application No. 18899044.4, dated Sep. 3, 2021, 11 pages.

* cited by examiner

FLEXIBLE SUBSTRATE, ELECTRONIC DEVICE, AND METHOD FOR MANUFACTURING ELECTRONIC DEVICE

TECHNICAL FIELD

The present application relates to a flexible substrate having flexibility, an electronic device using the flexible substrate, and a production method of the electronic device. The present application particularly relates to a flexible substrate and an electronic device having high pliability in the entire surface including a connection terminal portion, and a production method of the electronic device.

BACKGROUND ART

Devices having excellent pliability and flexibility such as flexible devices and stretchable devices can be easily installed on free-form surfaces and can be easily attached to products and structures with curved surfaces, human bodies, and clothing. Therefore, they are currently strongly demanded for practical use.

The following parts are integrated to configure electronic devices: parts functioning as an electronic device including a transistor, a logic circuit, a sensor, a light-emitting element, a piezoelectric element, and an actuator; and electronic elements having individual functions including a power source part such as a battery or a power-generating element, a memory part for data storage, a communication part such as an antenna for data communication and wireless power feeding, and a data display part such as a display. As a method for electrically connecting these functional parts, generally electronic elements are mounted on bases on which a connection wiring is formed, in order to be made into a product.

Many techniques have been developed and put into practical use as mounting methods for electrically connecting a plurality of electronic elements. Exemplary mounting methods include a through hole mounting method in which terminals of electronic components are fixed in holes of a printed substrate, and a method in which electronic components for surface mounting are mounted in place on a substrate using a chip mounter.

Further, flexible printed circuits (hereinafter, referred to as "FPC") are known as wiring circuits using flexible bases. The FPC is a circuit substrate in which a wiring pattern is formed using a conductive metal such as a copper foil on a base substrate made of a pliant resin insulating film such as polyimide. Owing to its pliability, the FPC has been used for electric wiring of moving parts that are to be bent repeatedly, including a hinge part that rotatably connects a main body part and a display part of a laptop computer, and an arm of a hard disk drive. In addition to the moving parts, the FPC has been widely used for three-dimensional wiring that can downsize an electronic device housing, the three-dimensional wiring including bending an FPC connected to a main substrate, and mounting an electronic element on the bent portion to be stacked on the main substrate.

With regard to the flexible printed circuit substrates (FPC), Patent Document 1 proposes a technique of forming slits or grooves between connection wiring of a wiring section to increase the bendability of the wiring section and prevent the damage of the connection wiring, in an FPC composed of a display unit and a wiring section that includes a connection wiring for connecting the display unit and a driving circuit (see Patent Document 1).

Meanwhile, as a technique of joining polymer materials, a production example of a μ-TAS device disclosed by Patent Document 2 is known in which surfaces of resin substrates are activated by vacuum-ultraviolet light having a wavelength of 172 nm or less (see Patent Document 2). In the prior art, by irradiating two resin substrates made of the same material with ultraviolet rays having a wavelength of 172 nm, adhesion interfering substances such as organic substances adhering to the surfaces of the resin substrates decompose so that the surfaces are cleaned, while the polymer main chain on the outermost surfaces of the resin substrates decomposes and the surfaces of the resin substrates become highly active. The active resin substrate surfaces easily react with oxygen and vapor in the air and create a highly active adhesive layer on the surfaces of the resin substrates. By pressure-bonding the highly active adhesive layers thus obtained, the resin material can be joined under a relatively low temperature condition of 100° C. or less, and sufficiently high adhesive strength is obtained.

PRIOR ART DOCUMENTS

Patent Documents

Patent Document 1: JP 2011-237661 A
Patent Document 2: JP 2006-187730 A

DISCLOSURE OF INVENTION

Problem to be Solved by the Invention

In the conventional electronic devices in which the FPC is used, the slits or grooves, which are formed between the connection wiring of the wiring section, reduce the rigidity of the FPC and allow it to be bent easily, while preventing an excessive load from being applied to the connection wiring even when a twist that causes a certain degree of bending in an extending direction of the wiring is generated. Thus, highly reliable electronic devices can be produced.

However, the conventional electronic devices in which the FPC is used are not designed to have pliability in a connection part between the FPC and a display unit, or in a connection terminal portion where the electronic device is connected with another circuit substrate. Because of this, the electronic element mounting portion and the connection terminal portion do not have pliability even in the case of configuring an electronic device including a flexible electronic element such as a film-type display developed recently or an organic semiconductor transistor. Thus, electronic devices having pliability as a whole have not been realized.

Further, bonding techniques between polymers (insulating material) are known, but findings have not been obtained as to a joining technique using conductive organic compounds.

It is an object of the present application to solve the problem of the conventional arts, and to provide a flexible substrate having high flexibility as a whole including an element mounting portion and a connection terminal portion, an electronic device having high flexibility as a whole using the flexible substrate, and a method for producing the electronic device.

Means for Solving Problem

In order to solve the problem, a flexible substrate disclosed in the present application includes: a flexible base;

and a conductive wiring made of a conductive organic compound formed on the base, wherein part of the conductive wiring serves as a connection part with another electronic member.

An electronic device disclosed in the present application includes: a flexible base; a conductive wiring made of a conductive organic compound formed on the base; and an electronic element connected to the conductive wiring, wherein part of the conductive wiring serves as a connection part with another substrate.

A method for producing an electronic device disclosed in the present application is a method for producing an electronic device including a plurality of bases on each of which a conductive wiring made of a conductive organic compound is formed, an electronic element being connected to the conductive wiring in at least one of the plurality of bases, and the plurality of bases being connected to each other via a connection part constituted by the conductive wirings. The method includes: applying heat and pressure in a state where the conductive wirings on the bases are in direct contact with each other to form a connection part where the conductive wirings on the different bases are connected to each other.

Effects of the Invention

The flexible substrate and the electronic device disclosed in the present application can exhibit high flexibility as a whole including the connection part, because the connection part with another electronic member or the connection part between flexible substrates are constituted by the conductive wiring made of a conductive organic compound formed on the flexible base.

Further, according to the production method of the electronic device disclosed in the present application, the conductive wirings made of a conductive organic compound formed on the flexible bases favorably adhere to each other to form the connection part having high conductivity and adhesiveness. Therefore, it is possible to configure an electronic device having satisfactory electrical characteristics and mechanical strength, at a low cost.

DESCRIPTION OF THE INVENTION

Figure 1:
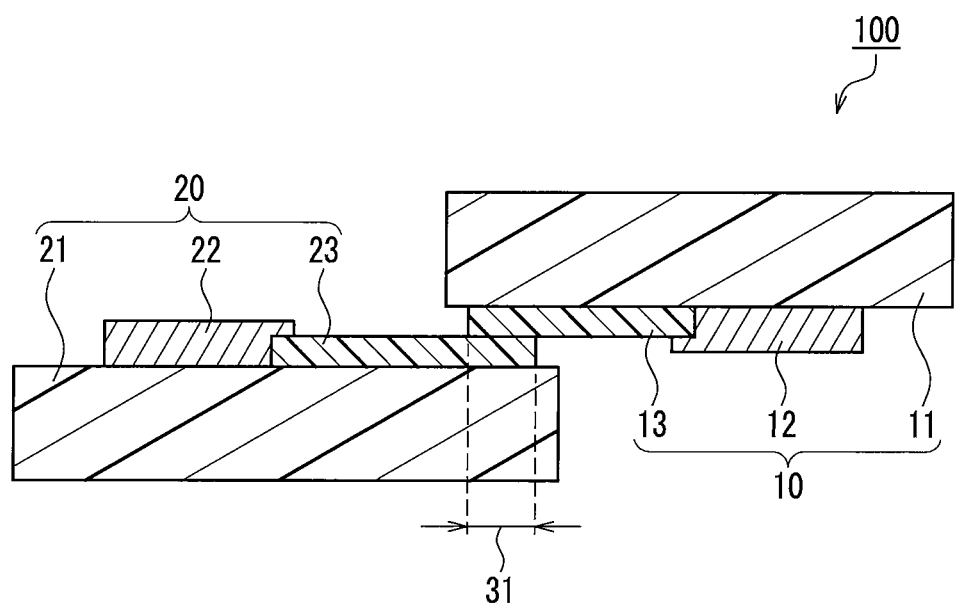
FIG. 1 is a cross-sectional configuration view illustrating the configuration of an electronic device of this embodiment.

The flexible substrate disclosed in the present application includes a flexible base, and a conductive wiring made of a conductive organic compound formed on the base, wherein part of the conductive wiring serves as a connection part with another electronic member.

With this configuration, the flexible substrate disclosed in the present application has flexibility in the connection part with another electronic member such as another substrate or a display device, thereby having flexibility as a whole.

In the present specification, "having flexibility" means that the flexible substrate or electronic device can bend as a whole when a predetermined external force is applied thereto, and can return to its original shape when the applied external force is released. Further, in the case where the base constituting the flexible substrate or electronic device is extremely pliable, it may bend by its own weight without applying an external force. Such a case in which the flexible substrate or electronic device can bend by its own weight and exhibit predetermined electric characteristics even in the bent state is included as "having flexibility" in the present specification.

The electronic device disclosed in the present application includes: a flexible base; a conductive wiring made of a conductive organic compound formed on the base; and an electronic element connected to the conductive wiring, wherein part of the conductive wiring serves as a connection part with another substrate.

With this configuration, the electronic device disclosed in the present application has flexibility in the connection part with another electronic member such as another substrate or a display device, thereby having flexibility as a whole.

In the electronic device disclosed in the present application, it is preferred that the conductive wiring is formed on each of a plurality of the bases, the conductive wiring on one of the plurality of the bases is in direct contact with the conductive wiring on another one of the plurality of the bases to form the connection part, and in at least one of the plurality of the bases, the electronic element is connected to the conductive wiring. With this configuration, it is possible to configure an electronic device including a plurality of bases having flexibility including the connection part.

It is preferred that the conductive wiring is made of a conductive polymer. By doing so, it is possible to configure a pliable conductive wiring.

In this case, it is preferred that the conductive wiring includes, as a main component, any one of polythiophene, polyaniline, polypyrrole and polyacetylene, or a derivative of any one of these.

Further, it is preferred that the conductive wiring is made of a composite material in which conductive particles are dispersed in a polymeric binder. By doing so, it is possible to configure a pliable conductive wiring.

Further, it is preferred that in the connection part, an adhesion layer made of an insulating material is formed between the base and the conductive wiring. By doing so, adhesion layers arranged in the wiring space area of the conductive wirings adhere to each other, and satisfactory adherence can be obtained in the whole connection part including the conductive wiring part. Therefore, it is possible to configure an electronic device having high electrical conduction and high adhesive strength.

In this case, it is more preferred that the adhesion layer has a lower heat resistance temperature than the base.

The method for producing an electronic device disclosed in the present application is a method for producing an electronic device including a plurality of bases on each of which a conductive wiring made of a conductive organic compound is formed, an electronic element being connected to the conductive wiring in at least one of the plurality of bases, and the plurality of bases being connected to each other via a connection part constituted by the conductive wirings. The method includes: applying heat and pressure in a state where the conductive wirings on the bases are in direct contact with each other to form a connection part where the conductive wirings on the different bases are connected to each other.

According to the production method of the electronic device disclosed in the present application, the conductive wirings sufficiently adhere to each other, whereby it is possible to configure an electronic device that includes the connection part having high electrical conduction properties and adhesive strength, at a low cost.

It is preferred that the heat to be applied is lower than a glass transition temperature of a material constituting the conductive wiring.

Hereinafter, embodiments of the flexible substrate, the electronic device, and the production method of the electronic device disclosed in the present application will be described with reference to the drawings.

The drawings are illustrated for the sake of easy understanding of the invention disclosed in the present application. The sizes of the constituent members, particularly the sizes in the thickness direction of the flexible substrate in the drawings, do not faithfully reflect the actual sizes or shape ratios of the constituent members.

Embodiment

Figure 2:
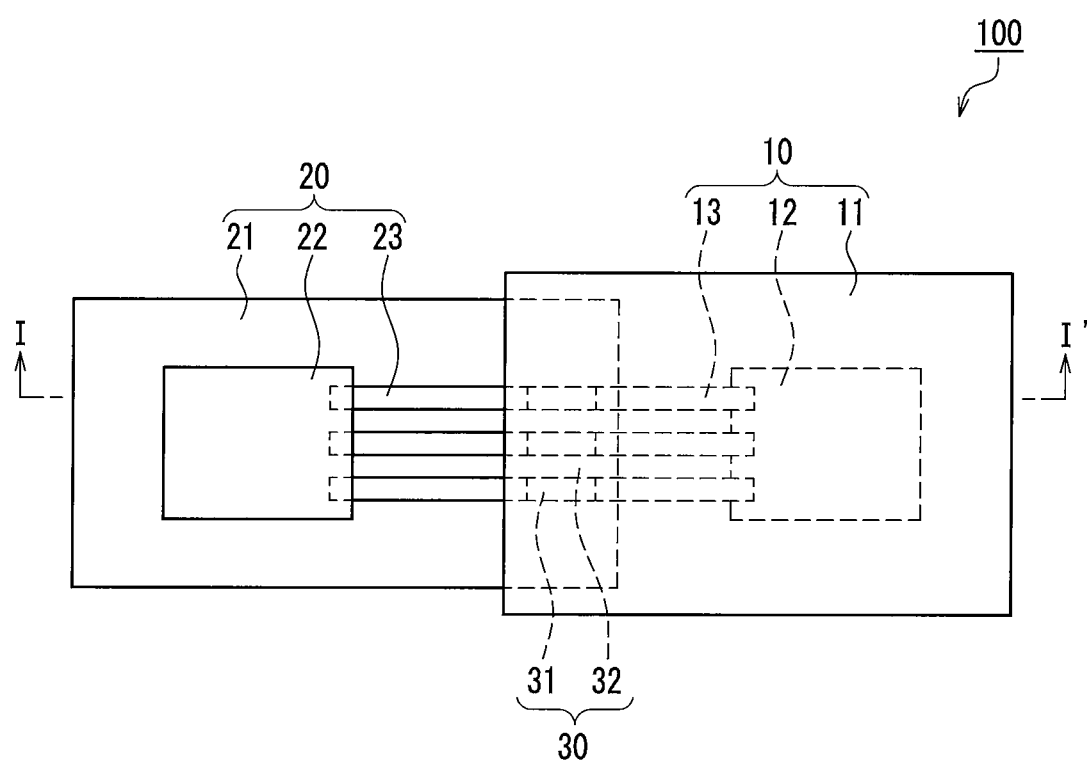
FIG. 2 is a planar configuration view illustrating the configuration of the electronic device of this embodiment.

FIG. 1 is a cross-sectional configuration view of an electronic device of this embodiment. FIG. 2 is a planar configuration view of the electronic device of this embodiment. FIG. 1 illustrates a cross section taken along a line I-I' in FIG. 2.

An electronic device 100 of this embodiment has a first flexible substrate 10 and a second flexible substrate 20, on each of which an electronic element is mounted as illustrated in FIGS. 1 and 2.

The first flexible substrate 10 includes: a flexible base 11; a first electronic element 12 disposed on the base 11; and a conductive wiring 13 made of a conductive organic compound that is connected to a terminal (not illustrated) of the first electronic element 12. The second flexible substrate 20 includes: a flexible base 21; a second electronic element 22 disposed on the base 21; and a conductive wiring 23 made of a conductive organic compound that is connected to a terminal (not illustrated) of the second electronic element 22.

In the electronic device 100 of this embodiment, the first flexible substrate 10 and the second flexible substrate 20 are arranged so that a surface on which the electronic element 12 is mounted and a surface on which the electronic element 22 is mounted face each other, and an end of the conductive wiring 13 formed on the base 11 on a side opposite to the side connected to the electronic element 12 and located in a connection part 30 is in direct contact with an end of the conductive wiring 23 formed on the base 21 on a side opposite to the side connected to the electronic element 22 and located in the connection part 30, whereby electrical conduction is established. In this manner, in the electronic device 100 of this embodiment, a predetermined terminal of the first electronic element 12 mounted on the first flexible substrate 10 and a predetermined terminal of the second electronic element 22 mounted on the second flexible substrate 20 are connected electrically to each other to cause the electronic elements 12 and 22 to perform a given operation.

The bases 11 and 21 of the flexible substrates 10 and 20 may be made using various resin materials, sheet glasses, metal foils, silicone membranes, etc.

The bases 11 and 21 have flexibility. The flexibility is not uniquely defined by a quantitative index, and is not particularly limited as long as the electronic device 100 constituted by the flexible substrates 10 and 20 with the bases 11 and 21 can exhibit flexibility of a required range as a whole. From this aspect, properties of the various materials to be used as the bases 11 and 21 and the thickness of the bases 11 and 21 can be selected appropriately. For example, when a hard material having a relatively high Young's modulus of 10 GPa or more such as metal, an inorganic material or a glass material is used, the thickness of the bases may be 1 mm or less. Thus, a material that can exhibit required flexibility as a base is to be selected.

Examples of the resin materials to be used as the bases 11 and 21 include polyethylene naphthalate (PEN), polyethylene terephthalate (PET), polyimide (PI), polyamide (PA), polymethyl methacrylate (PMMA), polycarbonate (PC), polyethylene (PE), polypropylene (PP), polystyrene (PS), polyacrylic acid (PAA), polylactic acid (PLCA), parylene, polyurethane, silicone, other various rubber materials, elastomers, and fiber materials.

Among these resin materials, general-purpose resin bases having excellent heat resistance and surface smoothness such as PEN and PI are advantageous, in terms of availability, relatively low cost, ease of obtaining excellent electronic characteristics, and excellent pliability. Further, bases having both flexibility and stretchability such as silicone, urethane, and various rubber materials are advantageous, in terms of obtaining a stretchable flexible substrate and an electronic device stretchable as a whole.

The material of the bases of the flexible substrates of the present application is not particularly limited as long as it has a certain level of flexibility.

As the electronic elements 12 and 22 to be disposed on the bases 11 and 21, those having functions necessary to configure the electronic device 100 can be used, including various sensors, piezoelectric elements, power supply elements such as power-generating elements and batteries, and light-emitting elements.

In the electronic device 100 exemplified in FIGS. 1 and 2, although the electronic elements 12 and 22 are provided respectively on the first flexible substrate 10 and the second flexible substrate 20, it is unnecessary to provide the electronic elements 12 and 22 on both of the flexible substrates 10 and 20, and one of them may be a flexible substrate in which only a conductive wiring is formed on the base.

The conductive wirings 13 and 23 are made of a conductive polymer material. The conductive wirings 13 and 23 may also be made of a composite material in which a conductive particulate material such as conductive metal particles or carbon particles is dispersed in a polymeric binder such as resin or rubber. Therefore, the term "conductive organic compound" in the present specification refers to both of the conductive polymer material and the composite material in which a conductive particulate material is dispersed in a polymeric binder.

The conductive wirings 13 and 23 made of the conductive organic compound have pliability capable of changing the shape when an external force is applied thereto.

Examples of the conductive polymer material for forming the conductive wirings 13 and 23 include materials having conductivity such as polythiophene, polyacetylene, polyaniline, polypyrrole, polyparaphenylene, and polyparaphenylene vinylene. In particular, materials containing, as a main component, any one of polythiophene, polyaniline and polypyrrole, or a derivative of any one of these are more preferred from the viewpoint of easily obtaining high conductivity. Specific examples of which include: PEDOT:PSS, i.e., a composite of (poly(3,4-ethylenedioxythiophene:PEDOT) and polystyrene sulfonic acid (PSS); and materials containing PEDOT as a skeleton and other dopant materials. By using these materials, favorable conductive wirings 13 and 23 can be formed.

In the case where the material of the conductive wirings 13 and 23 is a composite material in which a conductive material is dispersed, specific examples thereof include: materials in which conductive powder is dispersed in silicone rubber; and materials in which a conductive material such as conductive carbon or metal powder is mixed in a pliant material such as natural rubber, synthetic rubber material, or elastomer. As the conductive powder, it is suitable to use fine materials such as metal nanomolecules and carbon nanomolecules in terms of forming soft conductive wirings.

The electronic device 100 of this embodiment includes the connection part 30 where the conductive wiring 13 of the first flexible substrate 10 is in surface contact with the conductive wiring 23 of the second flexible substrate 20 to establish electrical conduction.

In an area 31 in the connection part 30 where the conductive wiring 13 and the conductive wiring 23 face each other, the wiring material of the conductive wirings 13 and 23 is united at least at the surfaces of the wirings by utilizing the pliability of both of the conductive wirings 13 and 23. The united conductive wirings 13 and 23 on the flexible substrates 10 and 20 provide both reliable electrical conduction and adherence (difficult to peel off). The conductive wirings 13 and 23 can be united by applying predetermined heat and pressure in a state where the connection parts of the first flexible substrate 10 and the second flexible substrate 20 are arranged so that the conductive wirings 13 and 23 are overlapped to face each other. A specific method for uniting the conductive wirings 13 and 23 of the connection part will be detailed later.

In an area 32 in the connection part 30 where the conductive wirings 13 and 23 are not formed and the surfaces of the bases 11 and 21 face each other, i.e., in the wiring space area 32 of the conductive wirings 13 and 23, it is preferred that the bases 11 and 21 adhere to each other. Especially when the bases are constituted by the above-described resin material, the bases can firmly adhere to each other by at least partially melting the surfaces of the bases 11 and 21 in a heating and pressing process for uniting the conductive wirings 13 and 23. Consequently, the first flexible substrate 10 and the second flexible substrate 20 firmly adhere to each other not only at the facing area 31 of the conductive wirings 13 and 23 but also at the facing area 32 of the bases 11 and 21, whereby an electronic device 100 including the two flexible substrates 10 and 20 unlikely to separate from each other can be produced.

Next, an electronic device of a second configuration example of this embodiment will be described.

Figure 3:
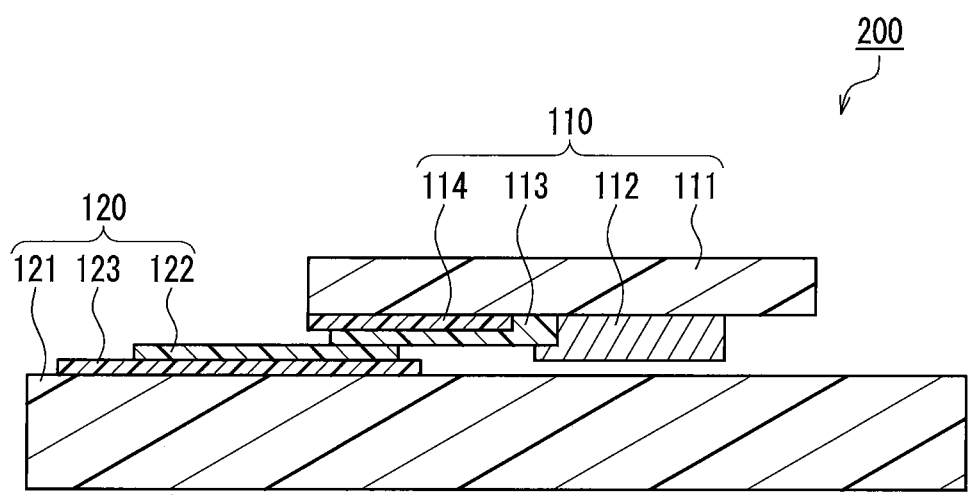
FIG. 3 is a cross-sectional configuration view illustrating an electronic device of a second configuration example of this embodiment.

FIG. 3 is a cross-sectional configuration view illustrating an electronic device of a second configuration example.

The electronic device of the second configuration example illustrated in FIG. 3 is different from the electronic device described with reference to FIGS. 1 and 2 in that an adhesion layer is formed between the base and the conductive wiring of the flexible substrate.

An electronic device 200 of the second configuration example has a first flexible substrate 110 and a second flexible substrate 120 as illustrated in FIG. 3.

The first flexible substrate 110 includes: a flexible base 111; an electronic element 112 disposed on the base 111; a pliable conductive wiring 113 connected to a terminal (not illustrated) of the electronic element 112; and an adhesion layer 114 interposed between the conductive wiring 113 and the base 111. The second flexible substrate 120 includes: a flexible base 121; a pliable conductive wiring 122 disposed on the base 21; and an adhesion layer 123 interposed between the conductive wiring 122 and the base 121.

The bases 111 and 121, the electronic element 112, and the conductive wirings 113 and 122 in the electronic device of the second configuration are the same as those of the electronic device described with reference to FIGS. 1 and 2. Therefore, the description thereof will be omitted. Further, in the electronic device 200 of the second configuration example illustrated in FIG. 3, although an electronic element is not provided on the second flexible substrate 120, the second flexible substrate 120 may be a flexible substrate provided with an electronic element like the electronic device 100 illustrated in FIGS. 1 and 2.

In the electronic device 200 of the second configuration example illustrated in FIG. 3, the material of the adhesion layers 114 and 123 may be the same as that of the bases 111 and 121. However, it is preferred that the material of the adhesion layers 114 and 123 has a lower glass transition temperature than the material of the bases 111 and 121.

For example, when the bases 111 and 121 are made of a resin material having high heat resistance such as polyimide, the adhesion layers 114 and 123 are made of a material having a lower softening point or glass transition point than the heat resistance temperature of polyimide. By doing so, it is possible to further improve the adherence in the connection part (part denoted by the reference numeral 30 in FIGS. 1 and 2) of the first flexible substrate 110 and the second flexible substrate 120.

In the electronic device of this embodiment, the conductive wirings are united by applying heat and pressure in the state where the exposed portions of the conductive wirings as the connection part of the flexible substrates are overlapped to face each other. At this time, as described above, it is preferred that the bases of the flexible substrates adhere to each other in the area where no conductive wiring is formed (the area denoted by the reference numeral 32 in FIG. 2). However, production conditions under which the opposed conductive wirings in the connection part can sufficiently adhere to each other (the area denoted by the reference numeral 31 in FIG. 2) may not allow the opposed bases in the connection part to sufficiently adhere to each other, if the heat resistance temperature (glass transition point or softening point) of the bases is relatively high, for example. In such a case, by providing, on the surface of the base, an adhesion layer made of a member that melts easier than the base, the flexible substrates adequately adhere to each other owing to the melted adhesion layer. Further, by providing the adhesion layer, the temperature to unite the conductive wirings in the connection part can be set low, whereby the deformation of the bases, which may occur due to the heat or pressure in the connection part forming process, is avoided.

In the second configuration of this embodiment, the adhesion layers 114 and 123, which are formed between the conductive wiring 113 and the base 111 and between the conductive wiring 122 and the base 121, respectively, are not particularly limited as long as they are formed on the entire connection part. The adhesion layers 114 and 123 do not need to be patterned so as to fill the wiring space area of the conductive wirings 113 and 122. Therefore, the adhesion layers 114 and 123 can be easily formed on the bases 111 and 121, and the production costs of the flexible substrate and the electronic device using the flexible substrate can be reduced.

In the second configuration illustrated in FIG. 3, although the adhesion layer is provided on both of the first flexible substrate 110 and the second flexible substrate 120, a certain amount of the effect can be obtained even in the case of providing the adhesion layer on only one of the flexible substrates. Specifically, if the flexible substrate disclosed in this embodiment is connected to an electronic element having flexibility itself such as a display device made of a resin substrate or a sheet-shaped air battery, an adhesion layer sometimes cannot be formed in the connection part on the electronic element side. In such a case, by providing an adhesion layer only on the flexible substrate side, it is possible to produce an electronic device including a connection part with high electric conductivity and adherence.

Next, an electronic device of a third configuration example of this embodiment will be described. The electronic device of the third configuration example of this embodiment has a configuration in which a plurality of flexible substrates are mounted on a large flexible substrate.

Figure 4:
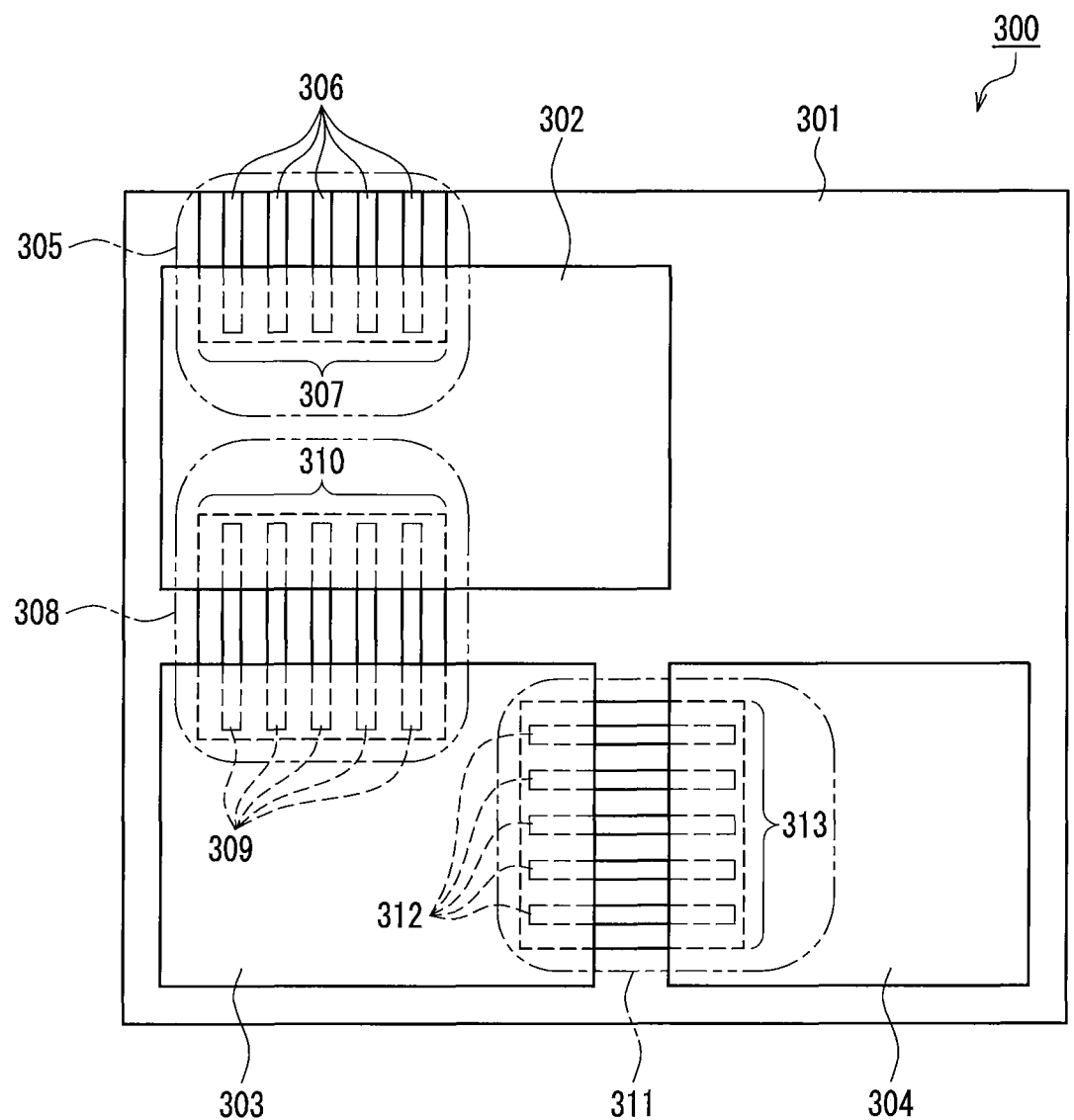
FIG. 4 is a planar configuration view illustrating an electronic device of a third configuration example of this embodiment.

FIG. 4 is a planar configuration view illustrating the electronic device of the third configuration example of this embodiment.

An electronic device 300 of the third configuration example has a configuration in which three relatively small flexible substrates—a second flexible substrate 302, a third flexible substrate 303, and a fourth flexible substrate 304—are mounted on one large first flexible substrate 301, as illustrated in FIG. 4.

In the configuration example illustrated in FIG. 4, a first connection part 305 located on the upper left of the first flexible substrate 301 is configured so that the conductive wiring of the first flexible substrate 301 and the conductive wiring of the second flexible substrate 302 are arranged to face each other and united in an overlapped area 306 to establish electrical conduction between the first flexible substrate 301 and the second flexible substrate 302. In the first connection part 305, an adhesion layer 307 is formed on the lower side of the conductive wiring to increase adherence between the first flexible substrate 301 and the second flexible substrate 302.

Similarly, the second flexible substrate 302 and the third flexible substrate 303 are connected in a second connection part 308 on the left side of FIG. 4, and the third flexible substrate 303 and the fourth flexible substrate 304 are connected in a third connection part 311 on the lower middle side of FIG. 4.

The second connection part 308 and the third connection part 311 are configured so that the conductive wirings of the second flexible substrate 302, third flexible substrate 303, and fourth flexible substrate 304 are arranged to face the conductive wirings for substrate connection formed on the first flexible substrate 301, and united in the overlapped areas 309 and 312 to establish electrical conduction. Further, in the second connection part 308 and the third connection part 311 of the first flexible substrate 301, adhesion layers 310 and 313 are formed on the lower side of the conductive wirings to increase adherence between the first flexible substrate 301 and the second, third, and fourth flexible substrates 302, 303, and 304.

With this configuration, in the electronic device 300 of the second configuration example of this embodiment, electrical conduction is established in the order from the first flexible substrate 301 to the second flexible substrate 302, from the second flexible substrate 302 to the third flexible substrate 303, and from the third flexible substrate 303 to the fourth flexible substrate 304 to constitute an electric circuit that utilizes electronic elements arranged on the flexible substrates.

As is clear from the above description, the conductive wirings on the first flexible substrate 301 formed in the second connection part 308 and the third connection part 311 are not connected with other electronic elements mounted on the first flexible substrate 301, and they are formed exclusively for the purpose of establishing electrical conduction with other flexible substrates. However, for example, the fourth flexible substrate 304, which is to be connected to the first flexible substrate 301 via the second flexible substrate 302 and the third flexible substrate 303, may instead be connected directly to the first flexible substrate 301 by directly connecting the conductive wiring on the first flexible substrate 301 formed in the third connection part 311 to the electronic element disposed on the first flexible substrate 301. By doing so, it is possible to effectively shorten the length of a signal wiring that is susceptible to external noise, and the length of a connection wiring to a sensor circuit or the like that should be a low-resistance wiring.

In the electronic device of the second configuration example illustrated in FIG. 4, although the adhesion layers 307, 310 and 313 are formed in the connection parts 305, 308 and 311, respectively, it is unnecessary to form the adhesion layer in all of the connection parts, and part or all of the connection parts may not be provided with the adhesion layer. Further, the adhesion layer may be formed in both of the connection parts of the flexible substrates to be connected to each other.

Next, a method for producing the electronic device of this embodiment will be described.

In the flexible substrate of this embodiment, for example, a conductive wiring (PEDOT:PSS) having a thickness of about 100 nm as a predetermined wiring pattern is formed on polyethylene naphthalate (PEN) having a thickness of 50 to 125 μm as a base. Similarly to the conventional method for forming a wiring pattern on a hard substrate, the wiring pattern constitutes a predetermined electronic circuit on the substrate in a manner corresponding to the positions of the terminals of the electronic element to be mounted on the substrate. Since the flexible pattern of the conductive wiring of this embodiment is made of a polymer compound or polymer composite compound, the predetermined wiring pattern can be formed by ink jet printing, screen printing, offset printing, gravure, and the like. Because of this, it is possible to form a desired wiring pattern at a low cost by a quite simple method, as compared with the conventional patterning method on a hard substrate or flexible wiring substrate (FPC) that includes formation of metal thin films and etching.

Further, when the electronic element to be mounted on the flexible substrate is an element that can be formed by printing, the electronic element can be printed on the printed conductive wiring in an overlapping manner to constitute an electronic circuit. This eliminates a chip mounting process using an automatic mounter, which has been performed in conventional printed substrates. Therefore, the positioning of electronic elements, including an arrangement of fine electronic elements, is simplified, and an electronic device in which electronic elements are precisely arranged on substrates can be produced at a low cost.

The connection part is formed in a predetermined position of the flexible substrate. In the connection part, the area where the conductive wirings are formed and the area where no conductive wiring is formed are arranged alternately. In the connection part, it is preferred that the conductive wiring lines are straight lines, and a ratio of the width of each conductive wiring line to the width of each wiring space between the conductive wiring lines is about 1:1. Although it is necessary that the width of each conductive wiring line in the connection part corresponds to the terminal width and the terminal interval of the other side to be connected in the connection part, such as another flexible substrate or electronic element, the width of each conductive wiring line is preferably 10 µm or more from the viewpoint of obtaining good electrical conduction properties in the connection part. Of course, the conductive wiring lines in the connection part may be curved lines, and the ratio of the width of each conductive wiring line to the width of each wiring space between the conductive wiring lines does not need to be about 1:1.

Further, an adhesion layer is formed in the connection part by forming a thin film using a material having a lower softening point temperature than the material of the base by, e.g., gravure offset printing on a PEN film (base) at a position where the connection part is to be formed, and thereafter a conductive wiring pattern is formed thereon.

The following describes a method for connecting with a connection part of another flexible substrate in the connection part of the flexible substrate.

In the case of configuring an electronic device by connecting flexible substrates on each of which a pliable conductive wiring is formed as illustrated in FIGS. 1 and 2, the connection parts of the two flexible substrates are overlapped to face each other, and heat and weight are applied from the outside of the bases of the flexible substrates.

For example, in the case of connecting the connection parts of two flexible substrates in each of which a conductive wiring (PEDOT:PSS) having a thickness of 100 nm is formed on a base (polyethylene naphthalate:PEN) having a thickness of 125 µm, a load of 2.2 MPa is applied for 180 seconds at a temperature of 150° C. By doing so, the contact portions of the conductive wirings melt partially so that the conductive wirings are united, and the surfaces of the bases adhere to each other. Thus, it is possible to form a connection part with sufficiently high conductivity and sufficiently high connection strength between the substrates.

It is preferred that the temperature to be applied for forming the connection part is lower than the heat resistance temperature of the base of the flexible substrate and the heat resistance temperature of the conductive wiring material. It is more preferred that the temperature for forming the connection part is lower than the glass transition temperature of the conductive wiring material. It is important that the pressure to be applied is an appropriate value to obtain adherence at an interface of the connection part. The pressure needs to be adjusted appropriately depending on the material and the thickness of the base of the flexible substrate and the material of the conductive wiring. As a guide, the pressure may be 1 MPa or more and 5 MPa of less.

EXAMPLES

An electronic device of this embodiment was actually produced, and characteristics thereof were evaluated.

First, two flexible substrates were produced as illustrated in FIGS. 1 and 2, and the connection parts were connected to evaluate the electrical characteristics and adherence.

Specifically, a first flexible substrate and a second flexible substrate were each prepared by arranging a conductive wiring (PEDOT:PSS) on one end of a base (PEN) so as to be parallel to the length direction of the substrate. The base was 10 mm wide, 50 mm long, and 125 µm thick. The width of each conductive wiring line was 200 µm, the wiring space between the conductive wiring lines was 200 µm, and the size ratio (line and space ratio) between an area where a conductive wiring pattern was formed and an area where a conductive wiring pattern was not formed was 1:1. The length of each conductive wiring line from the end of the base was 10 mm, the number of the conductive wiring lines was five, and the width of the connection part was 10 mm. The conductive wiring was formed in a thickness of 100 nm on the base by ink jet printing. No electronic element was mounted on the base because the evaluation purpose was to evaluate characteristics of the connection part.

The connection parts of the two flexible substrate thus produced were overlapped to face each other, and pressed with a pressure head maintained at 80° C. from above at a pressure of 2.2 MPa for 180 seconds to unite the conductive wirings on the bases, whereby an electronic device was produced. The width of the pressure head, i.e., the length of the pressuring part in the length direction of the conductive wiring in the connection part was 2 mm.

To confirm the electric conductivity of the connection part in the electronic device, an electrical resistance via the connection part of the first flexible substrate and the second flexible substrate was measured by Semiconductor Device Analyzer B1500A (trade name) manufactured by Agilent Technologies Japan, Ltd.

It was found from the result that the presence or absence of the connection part did not affect the wiring resistance, and electrical conduction was adequately established in the connection part.

The adherence in the connection part was measured by Universal Material Testing System 5565 (product model number) manufactured by INSTRON under conditions of a tensile speed of 10 mm/min, a distance between chucks of 40 mm, and a load cell of 100 N. As a result, the tensile-shear adhesive strength in the plane direction of the two flexible substrates was 2 N or more at room temperature.

Next, in the electronic device described in this embodiment, the influences of the temperature and the pressure applied at the time of forming the connection part were examined.

Figure 5A:
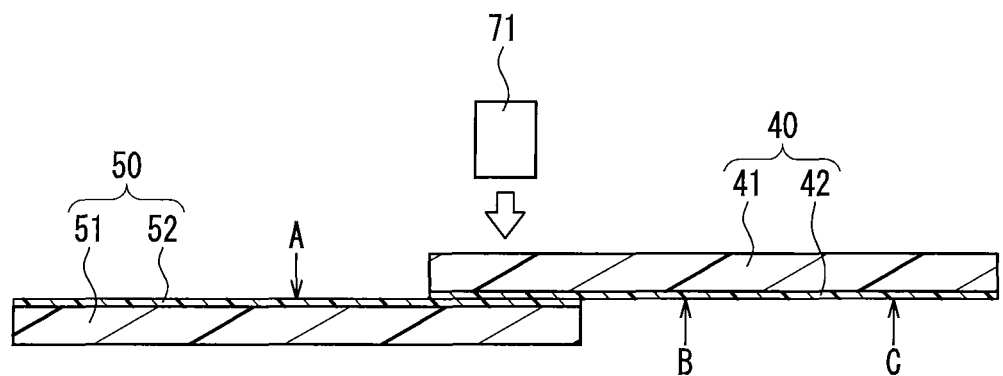
FIG. 5 is a view illustrating the shape of a sample used to evaluate characteristics of an electronic device produced as an example.
Figure 5B:
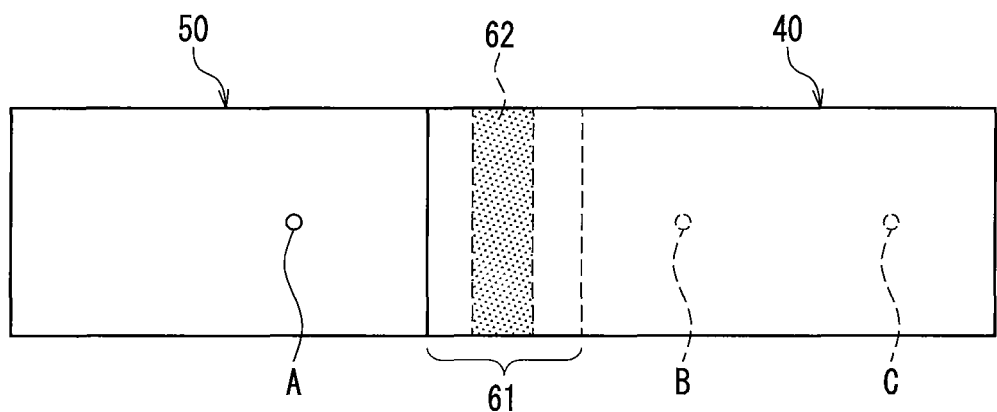

FIG. 5 illustrates the shape of a sample prepared to examine effects to be produced depending on formation conditions of the connection part. FIG. 5A is a cross-sectional view thereof, and FIG. 5B is a plan view thereof.

As illustrated in FIGS. 5A and 5B, a first sample piece 40 and a second sample piece 50 were prepared by forming PEDOT:PSS films 42 and 52 in a thickness of 100 nm on the entire surface of PEN resin bases 41 and 51, respectively, by ink jet printing. Each base was 10 mm wide, 50 mm long, and 125 µm thick.

These two sample pieces 40 and 50 were stacked so that the PEDOT:PSS films 42 and 52 would face each other, and an overlapped portion 61 would be 10 mm. A pressure head 71 (width: 2 mm) was pressed against substantially the center of the overlapped portion. The head temperature and the pressing force were changed. A portion denoted by the reference numeral 62 in FIG. 5B is a pressing portion of the pressure head 71.

The following were pressing conditions of the head 71. The head temperature was changed at intervals of 10° C. from 80° C. to 160° C., and the applied pressure was in four levels of 2.5 MPa, 5.2 MPa, 7.8 MPa, and 10.2 MPa. In all the conditions, the pressing time of the head 71 was 180 seconds.

The tensile-shear adhesive strength in the connection part of each sample was measured under the same conditions using the above Universal Material Testing System 5565 (product model number) manufactured by INSTRON.

Table 1 shows the measurement results.

TABLE 1

| Applied pressure | Temperature (° C.) | | | | | | | | |
|---|---|---|---|---|---|---|---|---|---|
| (MPa) | 80 | 90 | 100 | 110 | 120 | 130 | 140 | 150 | 160 |
| 2.5 | x | x | x | x | x | ○ | ○ | ○ | ○ |
| 5.2 | x | x | x | x | ○ | ○ | ○ | ○ | ○ |
| 7.8 | x | x | x | x | ○ | ○ | ○ | ○ | ○ |
| 10.2 | x | x | x | x | x | ○ | ○ | ○ | ○ |

In Table 1, samples having a tensile-shear adhesive strength of 5 N or more in the connection part are denoted by "○", and samples having a tensile-shear adhesive strength of less than 5 N are denoted by "x".

Table 1 indicates that, even when the head temperature was lower than the softening temperature of the sample piece base of 150° C., the conductive wiring material exhibited adhesive strength considered to be sufficiently high for practical use, and the conductive wiring material adequately adhered to each other by applying the pressure within an appropriate range.

It was confirmed from the analysis of the present inventors that the adhesive strength tends to increase as the applied pressure at the time of forming the connection part increases, regardless of the applied temperature. Further, it was confirmed that the applied temperature hardly affects the adhesive strength up to about 100° C., but higher than 100° C., the adhesive strength tends to increase as the applied temperature increases.

The following describes confirmation results of the conductivity of samples.

As illustrated in FIG. 5, a current flowing between a position A and a position B with the connection part 61 interposed therebetween and a current flowing between the position B and a position C with no connection part interposed therebetween were measured while changing the applied voltage. The spacing between the positions A and B and the spacing between the positions B and C were both 30 mm. All the samples were subjected to this measurement before the tensile test.

Figure 6:
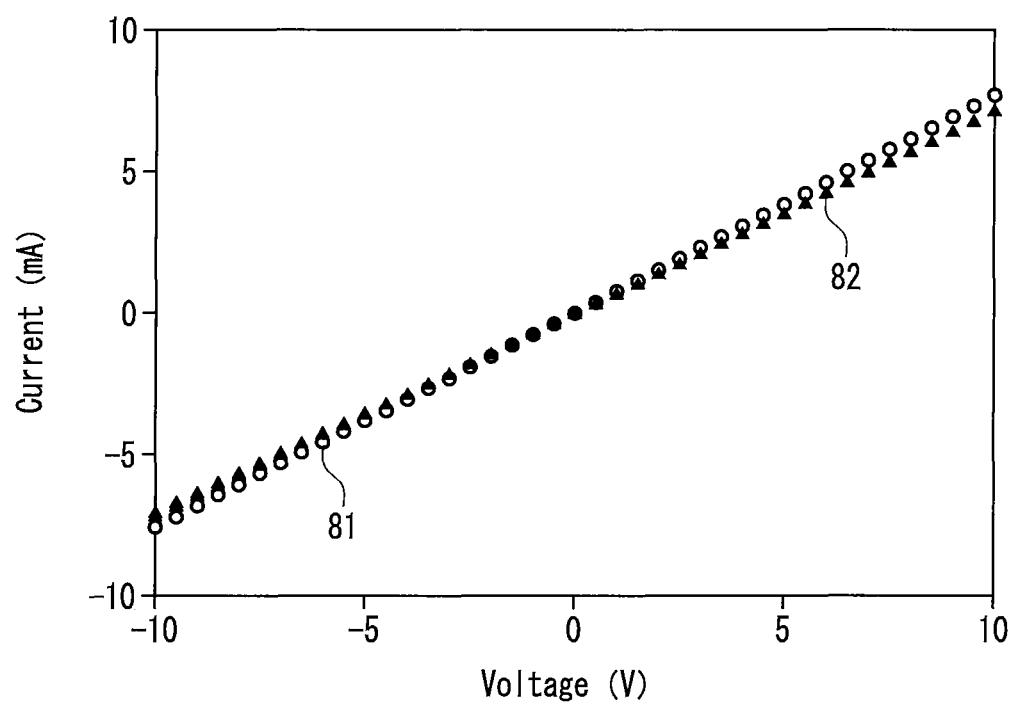
FIG. 6 is a view showing the results of characteristic evaluation of electric conductivity in the electronic device as an example.

FIG. 6 illustrates applied voltages, and currents flowing therebetween in the samples evaluated as "○" in Table 1, i.e., the samples having a tensile-shear adhesive strength of 5 N or more in the tensile test.

In FIG. 6, the reference numeral 81, which is denoted by "○", indicates voltage-current characteristics between A and B, and the reference numeral 82, which is denoted by "▲", indicates voltage-current characteristics between B and C. In FIG. 6, the applied temperature was 180° C., and the applied pressure was 2.2 MPa. In all the samples evaluated as "○" in Table 1, a difference between the current flowing between A and B and the current flowing between B and C was 1% or less, indicating that the PEDOT:PSS films 42 and 52 formed on the surfaces of the sample pieces adequately adhered to each other in the connection part. Further, as shown in FIG. 6, the resistance at the measurement point between A and B with the connection part interposed therebetween (denoted by the reference numeral 81) was slightly lower than the resistance at the measurement point between B and C with no connection part interposed therebetween (denoted by the reference numeral 82). The reason for this is considered to be that, since the conductive wirings overlapped each other in the connection part, the density (cross-sectional area) per length was higher in the connection part.

It was confirmed from the results shown in Table 1 and FIG. 6 that, when high adherence of the conductive wiring material is obtained by appropriately selecting formation conditions of the connection part, both the adhesive strength and the conduction characteristics in the connection part will be high.

It was confirmed that, also in the case of using the material in which metal nanoparticles are dispersed in a resin binder as the conductive wiring material, both the conductivity and the adherence can be obtained as above by applying the pressure and heat to the connection part under appropriate conditions.

Further, a sample including the adhesion layers 114 and 123 described in FIG. 3 was prepared as another example to evaluate the adherence.

Specifically, a first flexible substrate and a second flexible substrate were each prepared by forming a PMMA adhesion layer on one end of a PEN base by gravure offset printing, and arranging a PEDOT:PSS conductive wiring on the adhesion layer so as to be parallel to the length direction of the substrate by ink jet printing. Each base was 10 mm wide, 50 mm long, and 50 μm thick. Each adhesion layer was 1 μm thick, 10 mm wide (the same width as the base), and 10 mm long from the end. The width of each conductive wiring line was 200 μm similarly to the above example, the wiring space between the conductive wiring lines was 200 μm, the length of each conductive wiring line from the end of the base was 10 mm, and the number of the conductive wiring lines was five.

The conductive wiring was an organic conductive polymer (VERAZOL (registered trademark) R: trade name), i.e., a PEDOT-based conductive material, manufactured by Soken Chemical & Engineering Co., Ltd. The glass transition points of the PEN and the PMMA as the materials were 150° C. and 100° C., respectively. These values were measured by a differential scanning calorimeter DSC7000X (trade name) manufactured by Hitachi, Ltd.

The conductivity and the adherence of the sample thus formed were evaluated in the same manner as described above. As a result, it was confirmed that the presence or absence of the connection part did not affect the wiring resistance, and the electrical conduction was adequately established in the connection part. Further, the tensile-shear adhesive strength in the plane direction of the flexible substrates was 5 N or more.

As described above, the electronic device of this embodiment has a configuration in which the bases of the flexible substrates are made of a flexible member, the conductive wirings formed on the bases are made of a pliant member, and the conductive wirings adhere to each other in the connection part, thereby having flexibility in the entire flexible substrates including the connection part. By using a flexible member such as a resistance element made of an organic film or an organic semiconductor element as an electronic element to be mounted on the flexible substrate, it is possible to configure an electronic device having favorable flexibility as a whole.

Further, for example, in the case of being connected to an electronic element having flexibility itself such as a display device made of an organic EL, it is possible to obtain an electronic device flexibility as a whole including the connection part.

Moreover, by arranging the conductive wirings formed on the flexible substrates to overlap each other and applying a predetermined pressure to the overlapped portion under a predetermined temperature condition, it is possible to form a connection part having excellent adhesive strength and electrical conductivity. Unlike anisotropic conductive films (ACF) that have been used for the connection part of conventional flexible substrates, it is unnecessary to perform a connection process that requires control of the orientation of the conductive material in the connection part. Therefore, both the material cost and the manufacturing cost can be reduced.

Further, similarly to the second flexible substrate 120 constituting the electronic device illustrated in FIG. 3, the flexible substrate described in this embodiment may be a wiring substrate on which no electronic element is mounted on the base. The flexible substrate described in this embodiment can configure an electronic device having flexibility as a whole including the connection part without using a connection member such as an anisotropic conductive film described above, both in the case of being connected to the flexible substrate described in this embodiment on which an electronic element is mounted like the first flexible substrate 110 illustrated in FIG. 3, and in the case of being connected to, e.g., a display device including a flexible organic EL, by forming a connection part constituted by a conductive wiring member described in this embodiment.

Further, in the electronic device according to this embodiment, since the conductive wiring is formed on the resin base by a printing process, the entire flexible substrate including an electronic element can be produced by the printing process if the electronic element to be mounted on the substrate can be formed by printing. This eliminates a chip mounting process that conventionally requires high accuracy, which is performed when an electronic element to be mounted on the substrate is small. Therefore, it is possible to produce flexible substrates at a low cost including the mounting cost.

INDUSTRIAL APPLICABILITY

The flexible substrate, the electronic device, and the production method of the electronic device disclosed in the present application enable production of an electronic device having flexibility as a whole at a low cost, and therefore they have high industrial applicability in this day and age, in which the size reduction, low cost, energy saving, and flexibility are demanded.

DESCRIPTION OF REFERENCE NUMERALS

10 First flexible substrate
11 Base
12 Electronic element
13 Conductive wiring
20 Second flexible substrate
21 Base
22 Electronic element
23 Conductive wiring
31 Connection part
100 Electronic device

The invention claimed is:
1. An electronic device, comprising:
first and second flexible substrates, each substrate comprising:
a flexible base;
a first conductive wiring formed on the flexible base and comprising a conductive organic compound; and
an electronic element connected to the first conductive wiring,
wherein a first part of the first conductive wiring of the first flexible substrate is in direct contact and united with a first part of the first conductive wiring of the second flexible substrate to form a first connection part so that the first flexible substrate and the second flexible substrate are electrically and mechanically connected to each other via the first connection part; and
a third flexible substrate, comprising:
a flexible base; and
a first conductive wiring formed on the flexible base and comprising a conductive organic compound,
wherein a first part of the first conductive wiring of the third flexible substrate is in direct contact and united with a second part of the first conductive wiring of the first flexible substrate to form a second connection part so that the first flexible substrate and the third flexible substrate are electrically and mechanically connected to each other via the second connection part.

2. The electronic device according to claim 1, wherein the third flexible substrate comprises an electronic element connected to the first conductive wiring of the third flexible substrate.

3. The electronic device according to claim 1, wherein the conductive wirings of the first and the second substrates comprise a conductive polymer material.

4. The electronic device according to claim 1, wherein the conductive wirings of the first and the second substrates comprise a composite material in which conductive particles are dispersed in a polymeric binder.

5. The electronic device according to claim 1, wherein the electronic element comprises an organic material, and each of the first and second flexible substrate as a whole including the electronic element and the first connection part has flexibility.

6. The electronic device according to claim 3, wherein the conductive wirings of the first and the second substrates comprise, as a main component, any one of polythiophene, polyaniline, polypyrrole and polyacetylene, or a derivative of any one of these.

7. An electronic device, comprising:
first and second flexible substrates, each substrate comprising:
a flexible base;
a first conductive wiring formed on the flexible base and comprising a conductive organic compound; and
an electronic element connected to the first conductive wiring,
wherein a first part of the first conductive wiring of the first flexible substrate is in direct contact and united with a first part of the first conductive wiring of the second flexible substrate to form a first connection part so that the first flexible substrate and the second flexible substrate are electrically and mechanically connected to each other via the first connection part; and
a third flexible substrate, comprising:
a flexible base; and
a first conductive wiring formed on the flexible base and comprising a conductive organic compound, wherein the first flexible substrate further comprises a second conductive wiring that is formed on the flexible base and comprises a conductive organic compound, a first part of the first conductive wiring of the third flexible substrate is in direct contact and united with a first part of the second conductive wiring of the first flexible substrate to form a second connection part so that the first flexible substrate and the third flexible substrate are electrically and mechanically connected to each other via the second connection part.

8. The electronic device according to claim 7, wherein the third flexible substrate comprises an electronic element connected to the first conductive wiring of the third flexible substrate.

9. The electronic device according to claim 7, wherein the conductive wirings of the first and the second substrates comprise a conductive polymer material.

10. The electronic device according to claim 7, wherein the conductive wirings of the first and the second substrates comprise a composite material in which conductive particles are dispersed in a polymeric binder.

11. The electronic device according to claim 7, wherein the electronic element comprises an organic material, and each of the first and second flexible substrate as a whole including the electronic element and the first connection part has flexibility.

12. The electronic device according to claim 9 wherein the conductive wirings of the first and the second substrates comprise, as a main component, any one of polythiophene, polyaniline, polypyrrole and polyacetylene, or a derivative of any one of these.

13. An electronic device, comprising:
first and second flexible substrates, each substrate comprising:
a flexible base;
a first conductive wiring formed on the flexible base and comprising a conductive organic compound; and
an electronic element connected to the first conductive wiring,
wherein a first part of the first conductive wiring of the first flexible substrate is in direct contact and united with a first part of the first conductive wiring of the second flexible substrate to form a first connection part so that the first flexible substrate and the second flexible substrate are electrically and mechanically connected to each other via the first connection part,
wherein each of the first flexible substrate and the second flexible substrate further comprises:
a second conductive wiring formed on the flexible base and comprising the conductive organic compound, and
a wiring space area formed between the first conductive wiring and the second conductive wiring, and
the electronic device further comprises an adhesion layer comprising an insulating material, the adhesion layer being formed between the base and the first conductive wiring in at least one of the first flexible substrate and the second flexible substrate, so that the wiring space area of the first flexible substrate adheres to the wiring space area of the second flexible substrate by the adhesion layer.

14. The electronic device according to claim 13, wherein the conductive wirings of the first and the second substrates comprise a conductive polymer material.

15. The electronic device according to claim 13, wherein the conductive wirings of the first and the second substrates comprise a composite material in which conductive particles are dispersed in a polymeric binder.

16. The electronic device according to claim 13, wherein the electronic element comprises an organic material, and each of the first and second flexible substrate as a whole including the electronic element and the first connection part has flexibility.

17. The electronic device according to claim 14 wherein the conductive wirings of the first and the second substrates comprise, as a main component, any one of polythiophene, polyaniline, polypyrrole and polyacetylene, or a derivative of any one of these.

* * * * *